(12) United States Patent
Chen et al.

(10) Patent No.: US 9,564,423 B2
(45) Date of Patent: Feb. 7, 2017

(54) POWER PACKAGE WITH INTEGRATED MAGNETIC FIELD SENSOR

(71) Applicant: Infineon Technologies AG, Neubiberg (DE)

(72) Inventors: Liu Chen, Munich (DE); Toni Salminen, Munich (DE); Stefan Mieslinger, Kottgeisering (DE); Giuliano Angelo Babulano, Ottobrunn (DE); Jens Oetjen, Ottenhofen (DE); Markus Dinkel, Unterhaching (DE); Franz Jost, Stuttgart (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/747,382

(22) Filed: Jun. 23, 2015

(65) Prior Publication Data

US 2016/0379966 A1    Dec. 29, 2016

(51) Int. Cl.
| | |
|---|---|
| *H01L 25/16* | (2006.01) |
| *H01L 43/02* | (2006.01) |
| *H01L 43/04* | (2006.01) |
| *H01L 43/08* | (2006.01) |
| *H01L 23/495* | (2006.01) |
| *H01L 23/31* | (2006.01) |
| *H01L 23/58* | (2006.01) |
| *H01L 23/498* | (2006.01) |
| *G01R 33/09* | (2006.01) |
| *G01R 33/07* | (2006.01) |

(52) U.S. Cl.
CPC .............. *H01L 25/16* (2013.01); *G01R 33/07* (2013.01); *G01R 33/09* (2013.01); *H01L 23/3107* (2013.01); *H01L 23/49541* (2013.01); *H01L 23/49575* (2013.01); *H01L 23/49838* (2013.01); *H01L 23/58* (2013.01); *H01L 43/02* (2013.01); *H01L 43/04* (2013.01); *H01L 43/08* (2013.01)

(58) Field of Classification Search
CPC ........................... H01L 25/16; H01L 23/49575
USPC ................................................... 257/341, 427
See application file for complete search history.

(56) References Cited

U.S. PATENT DOCUMENTS

| | | | |
|---|---|---|---|
| 7,199,435 B2 * | 4/2007 | Elbanhawy | ............ H01L 27/22 257/379 |
| 2013/0264721 A1 | 10/2013 | Landau et al. | |
| 2014/0327436 A1 | 11/2014 | Castro Serrato | |

FOREIGN PATENT DOCUMENTS

| | | |
|---|---|---|
| DE | 102007044485 A1 | 4/2009 |
| DE | 102013103351 A1 | 10/2013 |
| DE | 102014106133 A1 | 11/2014 |

* cited by examiner

*Primary Examiner* — Mark Prenty
(74) *Attorney, Agent, or Firm* — Murphy, Bilak & Homiller, PLLC

(57) ABSTRACT

A power semiconductor package includes a substrate having a plurality of metal leads, a power semiconductor die attached to a first one of the leads and a magnetic field sensor integrated in the same power semiconductor package as the power semiconductor die and positioned in close proximity to a current pathway of the power semiconductor die. The magnetic field sensor is operable to generate a signal in response to a magnetic field produced by current flowing in the current pathway, the magnitude of the signal being proportional to the amount of current flowing in the current pathway.

17 Claims, 17 Drawing Sheets

POWER PACKAGE WITH INTEGRATED MAGNETIC FIELD SENSOR

TECHNICAL FIELD

The present application relates to power semiconductor packages, in particular power semiconductor packages with integrated magnetic field sensors.

BACKGROUND

Power packages include one or more power semiconductor dies such as power transistor and/or power diode dies attached to a substrate such as a lead frame or ceramic substrate having a patterned metallized surface. In each case, accurate current and/or temperature measurements are needed to ensure reliable and safe operation of the power package. Some current/temperature sensors are implemented using external components such as resistive shunts which are highly precise, but and complicate the package design. Other conventional approaches integrate an electrical-type sensor in the power semiconductor die. This approach reduces the complexity of the package design, but at the expense of reduced precision. Typical integrated electrical-type sensors such as a diode whose voltage is representative of temperature or current have poor sense accuracy e.g. +/−28%. The sense accuracy can be improved e.g. to +/−2% with customer calibration, but this requires calibration effort which increases cost. Some applications run with a defined safety margin or shut down feature in order to avoid over-current/heat and damage of the power semiconductor devices.

SUMMARY

According to an embodiment of a power semiconductor package, the power semiconductor package comprises a substrate having a plurality of metal leads, a power semiconductor die attached to a first one of the leads, and a magnetic field sensor integrated in the same power semiconductor package as the power semiconductor die and positioned in close proximity to a current pathway of the power semiconductor die. For example, the magnetic field sensor can be embedded in the power semiconductor die, disposed on the power semiconductor die, disposed on one or more of the leads, or disposed over or under a metal clip included in the power semiconductor package and which electrically connects one or more of the leads to the power semiconductor die or to another one of the leads. The magnetic field sensor is operable to generate a signal in response to a magnetic field produced by current flowing in the current pathway, the magnitude of the signal being proportional to the amount of current flowing in the current pathway.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide for the integration of a magnetic field sensor such as a magnetoresistive (XMR) sensor or a Hall sensor into a power semiconductor package for integrated current and/or temperature measurement. The magnetic field sensor generates a signal in response to a magnetic field produced by current flowing in a current pathway of a power semiconductor die included in the package. The magnitude of the signal is proportional to the amount of current flowing in the current pathway, and indicates the current consumption of the power semiconductor die and/or temperature of the package. The power semiconductor package can be provided with or without galvanic isolation between the magnetic field sensor and the power semiconductor die. In each case, the magnetic field sensor is integrated into the same power semiconductor package as the power semiconductor die for which current and/or temperature measurements are desired. For example, the magnetic field sensor can be embedded in the power semiconductor die, disposed on the power semiconductor die, disposed on one or more of the package leads, or disposed over or under a metal clip included in the power semiconductor package for electrically connecting one or more of the leads to the power semiconductor die or to another one of the leads. The term 'on' as used herein indicates position in contact or in close proximity with and supported by an exterior surface, or to indicate a source of attachment or support.

Figure 1A:
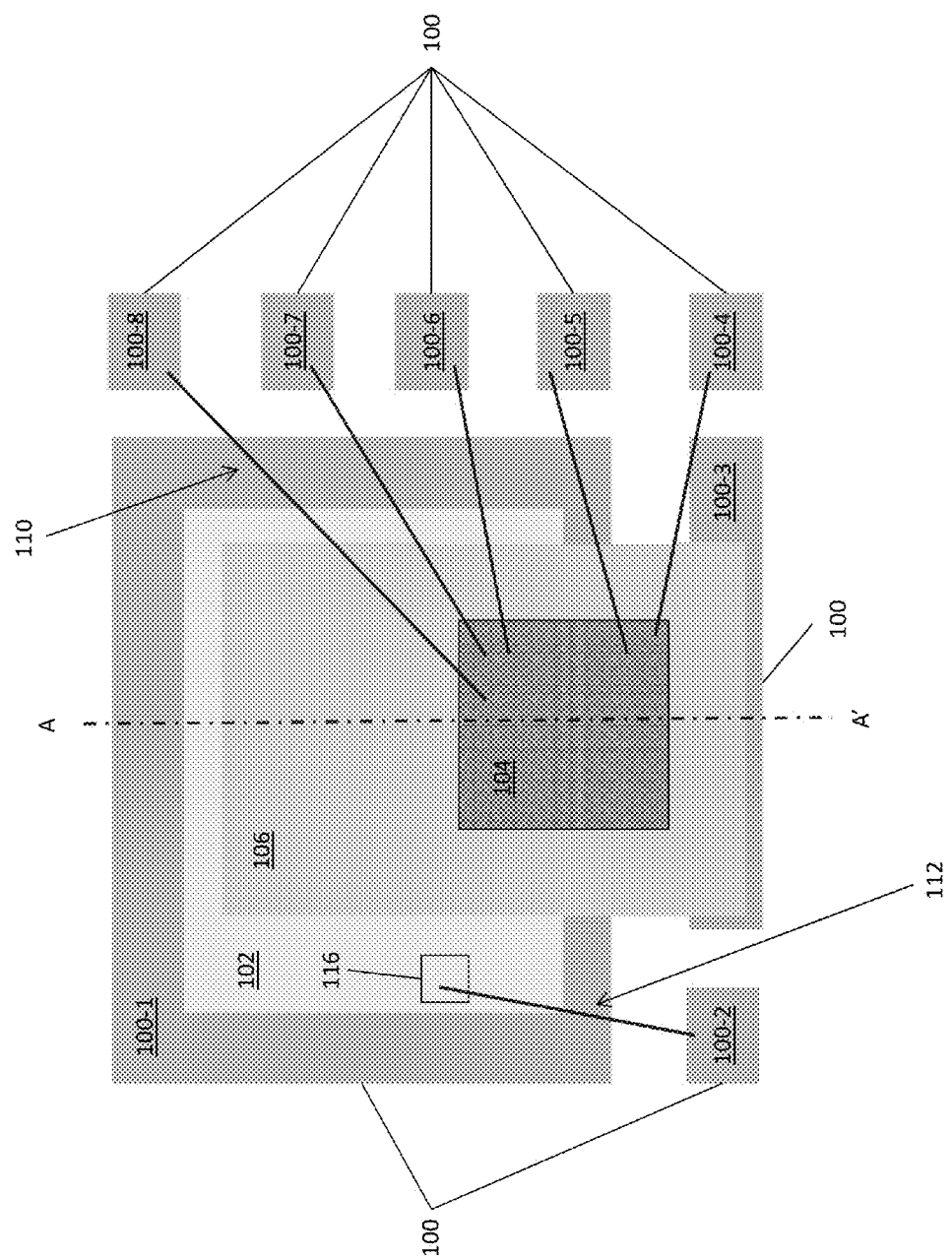
FIG. 1A illustrates a top down plan view of a first embodiment of a power semiconductor package having an integrated magnetic field sensor.
Figure 1B:
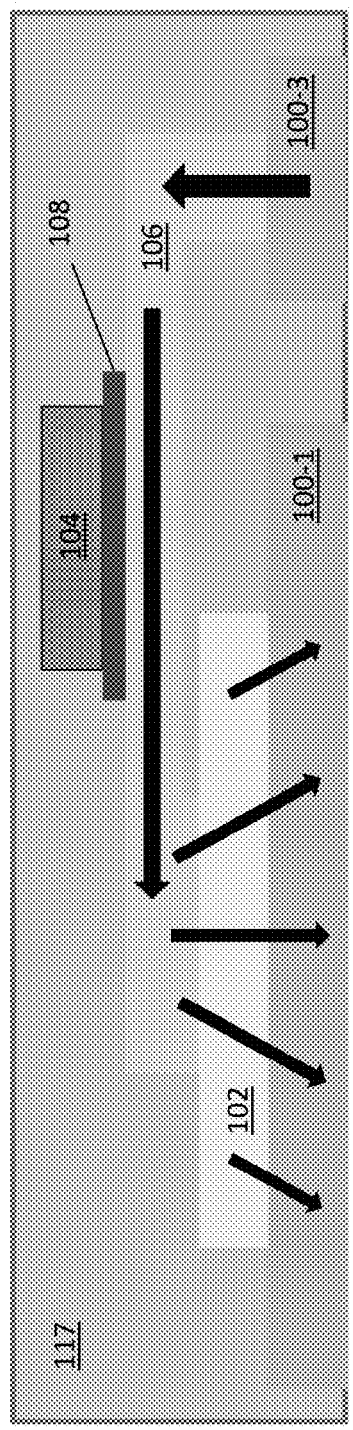
FIG. 1B illustrates a cross-sectional view of the package along the line labeled A-A' in FIG. 1A.

FIG. 1A illustrates a top down plan view of a first embodiment of a power semiconductor package, and FIG. 1B illustrates a cross-sectional view of the package along the line labeled A-A' in FIG. 1A. Die attach material and chip metallizations are not shown in FIGS. 1A and 1B for ease of illustration.

The power semiconductor package includes a substrate having a plurality of metal leads 100 and a power semiconductor die 102 attached to a first one of the leads 100-1. The package can include a single semiconductor die or more than one semiconductor die. Any standard semiconductor package substrate can be used. For example, the substrate can be a lead frame having a die paddle lead 100-1 to which the power semiconductor die 102 is attached and a plurality of signal and power leads 100-2 through 100-8 for providing signal and power connections to the power semiconductor die 102. In another example, the substrate can be a ceramic-based substrate such as a DCB (direct copper bonded) substrate, AMB (active metal brazed) substrate, or DAB (direct aluminum bonded) substrate in which one or both main sides of a ceramic base have a patterned metallized surface which form the leads 100 for attaching the power semiconductor die 102 and providing signal and power connections to the power semiconductor die 102. In other examples, the substrate can be a patterned metal substrate, a printed circuit board (PCB), etc. The power semiconductor package can be any type of standard semiconductor package having leads 100 for attaching the power semiconductor die 102 and providing signal and power connections to the power semiconductor die 102. For example, the power semiconductor package can be a molded package, an open cavity package with or without a lid, an encapsulated polymer package, a PCB-based package, etc. In each case, the term 'lead' as used herein refers to any insulated electrical conductor physically or electrically connected to an electrical device.

A magnetic field sensor 104 is integrated in the same package as the power semiconductor die 102, and positioned in close proximity to a current pathway of the power semiconductor die 102 so that the sensor 104 can sense a magnetic field produced by current flowing in the current pathway. According to the embodiment illustrated in FIGS. 1A and 1B, the magnetic field sensor 104 is disposed over a metal clip 106 included in the power semiconductor package. The metal clip 106 electrically connects one or more of the leads 100 to the power semiconductor die 102. In one case, the metal clip 106 is made of copper. However, the metal clip 106 can be made of other materials. In each case, the magnetic field sensor 104 generates a signal in response to a magnetic field produced by current flowing in a current pathway of the power semiconductor die 102. The current pathway is illustrated by arrows in FIG. 1B.

The magnitude of the signal generated by the magnetic field sensor 104 is proportional to the amount of current flowing in the current pathway, and indicates the current consumption of the power semiconductor die 102 and/or the temperature of the package. For example in the case of a Hall sensor, a transducer included in the magnetic field sensor 104 varies its output voltage in response to the magnetic field. In the case of a magnetoresistive (XMR) sensor such as an anisotropic magnetoresistive (AMR) sensor, giant magnetoresistive (GMR) sensor or tunnel magnetoresistive (TMR) sensor, the electric resistivity of a metal, semi-metal or semiconductor included in the magnetic field sensor 104 changes under the influence of the magnetic field. The orientation and configuration of the magnetic field sensor 104 can vary according the type of sensor device employed. In each case, the magnitude of the signal generated by the magnetic field sensor 104 is proportional to the amount of current flowing in the current pathway of the power semiconductor die 102. As such, current flow through the power semiconductor die 102 and temperature within the package can be measured simultaneously.

For example in the case of a power MOSFET die, current flow through the source or drain of the power MOSFET can be measured accurately by positioning the magnetic field sensor 104 in close proximity to the source or drain current pathway of the device. In the case of an IGBT die, current flow through the emitter or collector of the IGBT can be measured accurately by positioning the magnetic field sensor 104 in close proximity to the emitter or collector current pathway of the device. In the case of a power diode die, current flow through the anode or cathode of the power diode can be measured accurately by positioning the magnetic field sensor 104 in close proximity to the anode or cathode current pathway of the device.

In some applications, the magnetic field sensor 104 may be powered or carry signals at a significantly lower voltage (e.g. 5V) as compared to the power semiconductor die 102 (e.g. 500V, 1000V or even higher). For these applications, the magnetic field sensor 104 can be galvanically isolated from the metal clip 106 and therefore from the power semiconductor die 102. In one embodiment, the magnetic field sensor 104 is spaced apart from the metal clip 106 by a spacer 108. The spacer 108 can be electrically conductive or electrically insulating. For example, the spacer 108 can be a conductive adhesive, sinter material, solder etc. for applications in the low to medium voltage range (e.g. up to 500V). In another example, the material of the spacer 108 can be chosen so as to provide galvanic isolation. The thickness of the spacer 108 can be chosen so that the strength of the magnetic field which enters the magnetic field sensor 104 is reduced to a non-destructive level. A relatively thick spacer is particularly advantageous for high current applications. In one embodiment, the spacer 108 is a semiconductor die such as a silicon die interposed between the magnetic field sensor 104 and the metal clip 106. In other embodiments, the spacer 108 can be a polymer, ceramic, non-conductive adhesive, non-conductive film, or any other single or multi-layer material which separates the magnetic field sensor 104 from the metal clip 106. Alternatively, the magnetic field sensor 104 can be directly attached to the metal clip 106 e.g. by solder if the sensor 104 has a solderable backside or by a non-electrically conductive adhesive.

Electrical connections can be made to the magnetic field sensor by electrical conductors 110 such as wire bonds, wire ribbons, etc. which are attached at one end to the magnetic field senor 104 and at the opposing end to one or more of the package leads 100. An additional electrical conductor 112 electrically connects a separate pad 114 on the topside of the power semiconductor die 102 to a corresponding package lead 100-2 e.g. to form a gate connection for a transistor die. The metal clip 106 can provide the drain (MOSFET) or collector (IGBT) connection in the case of a power transistor, or the anode or cathode connection in the case of a power diode. An electrical connection to the backside of the power semiconductor die 102 is provided by the package lead 100-1 attached to this side of the die 102. This electrical connection can be the source (MOSFET) or emitter (IGBT) connection in the case of a power transistor, or the cathode or anode connection in the case of a power diode.

The power semiconductor package can be molded or encapsulated with a non-conductive material 117 such as a mold compound, adhesive, silicone, silicone gel, etc. The non-conductive material 117 is not shown in FIG. 1A for ease of illustration. In addition to the reliability provided by such a mold/encapsulant 117, the dielectric properties of the mold/encapsulant 117 also ensure good electrical insulation between the sensor 104 which operates at a relatively low voltage (e.g. 5V) and the power semiconductor die 102 which operates at a relatively high voltage (e.g. several hundred or thousands of volts).

Figure 2:
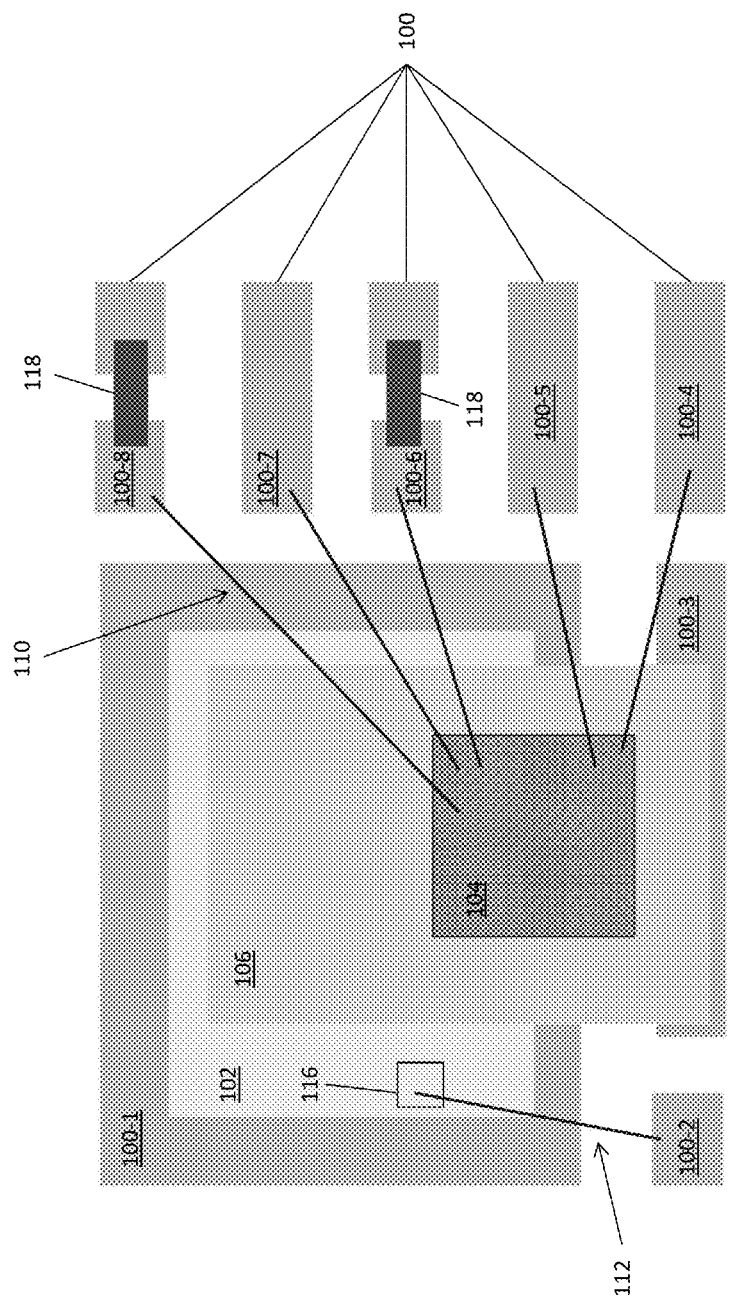
FIG. 2 illustrates a top down plan view of a second embodiment of a power semiconductor package having an integrated magnetic field sensor.

FIG. 2 illustrates a top down plan view of a second embodiment of the power semiconductor package. The embodiment shown in FIG. 2 is similar to the embodiment shown in FIGS. 1A and 1B. Different, however, passive components 118 such as resistors and/or capacitors which comprise part of the sensing circuit that includes the magnetic field sensor 104 are also integrated in the same package as the sensor 104 and the power semiconductor die 102. The passive components 118 are attached to different ones of the package leads 100. Electrical conductors 110 such as wire bonds, wire ribbons, etc. electrically connect the passive components 118 to the magnetic field sensor 104.

Figure 3:
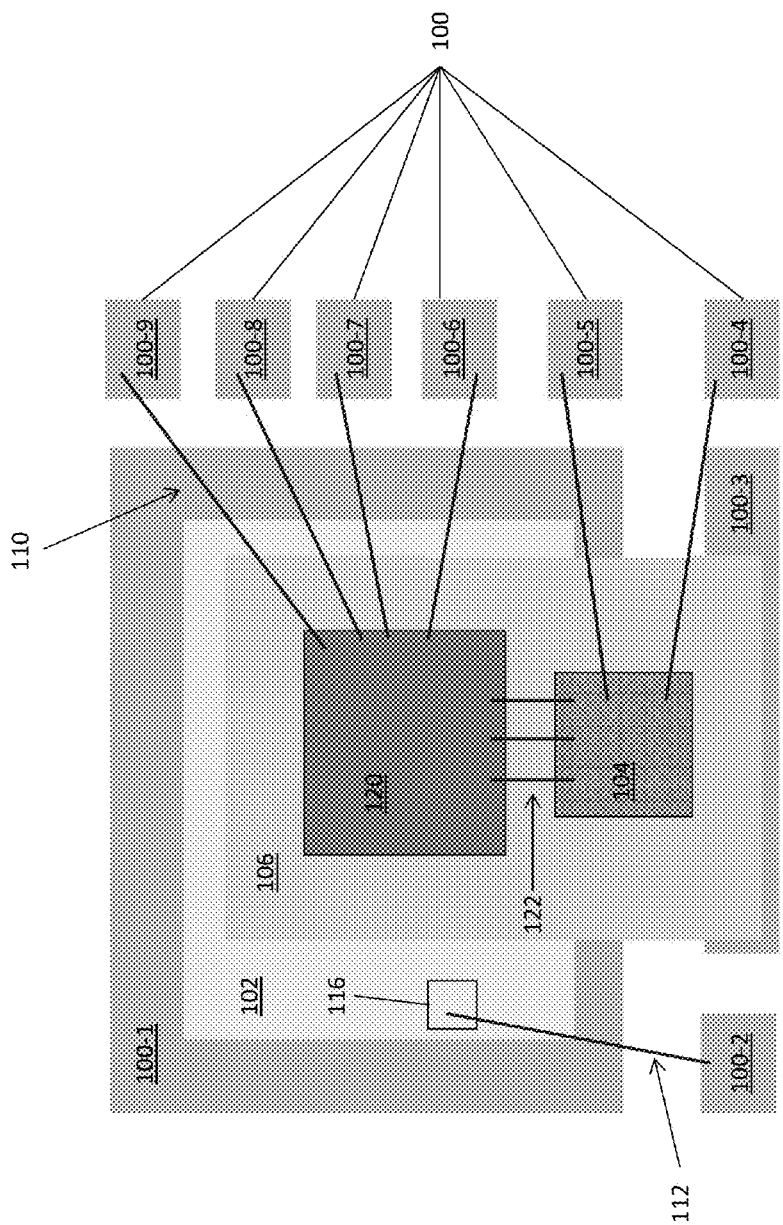
FIG. 3 illustrates a top down plan view of a third embodiment of a power semiconductor package having an integrated magnetic field sensor.

FIG. 3 illustrates a top down plan view of a third embodiment of the power semiconductor package. The embodiment shown in FIG. 3 is similar to the embodiment shown in FIGS. 1A and 1B. Different, however, a logic device 120 for controlling the magnetic field sensor 104 is attached to the same metal clip 106 on which the sensor 104 is disposed. Any standard logic device such as a microcontroller, ASIC (application-specific integrated circuit), etc. capable of controlling operation of the magnetic field sensor 104 can be used. Electrical conductors 110 such as wire bonds, wire ribbons, etc. electrically connect the logic device 120 to one or more leads of the package to provide electrical connections to the logic device. Additional electrical conductors 122 such as wire bonds, wire ribbons, etc. electrically connect the logic device 120 to the magnetic field sensor 104.

Figure 4:
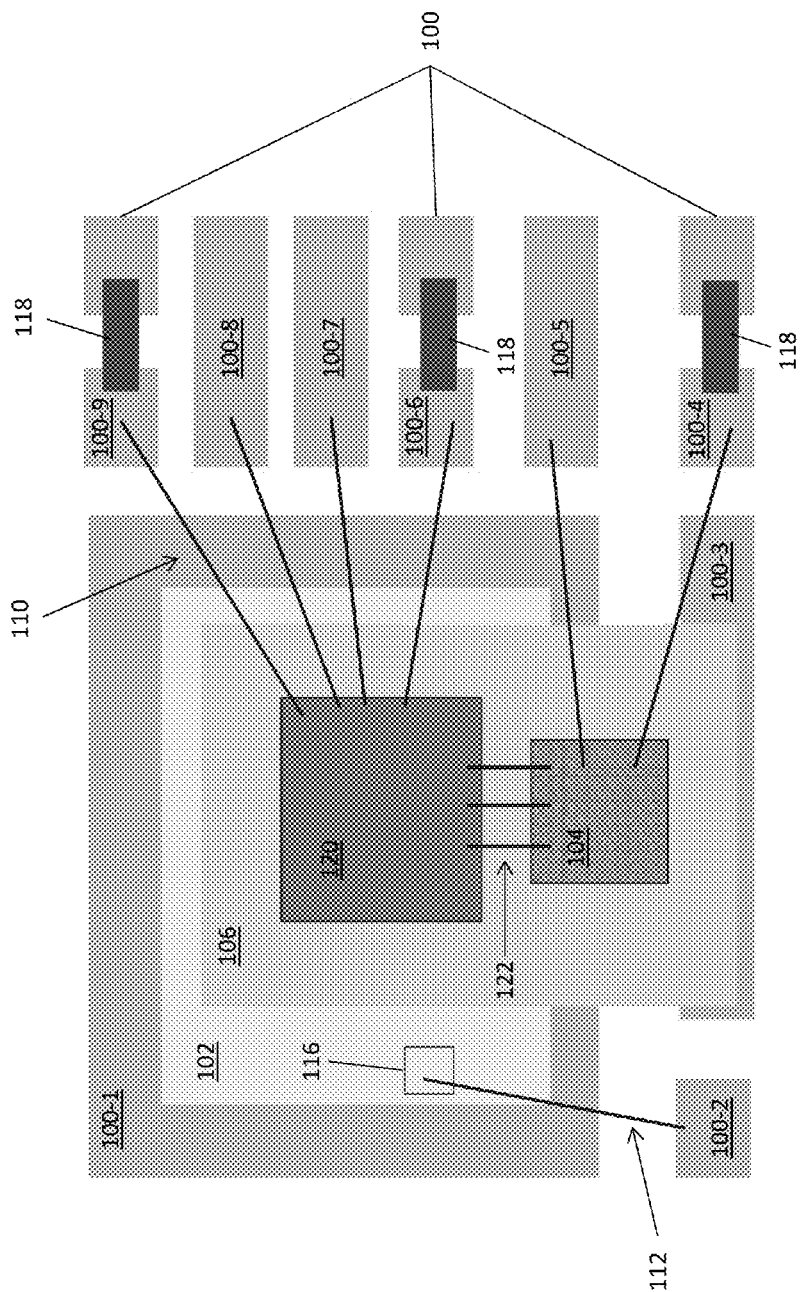
FIG. 4 illustrates a top down plan view of a fourth embodiment of a power semiconductor package having an integrated magnetic field sensor.

FIG. 4 illustrates a top down plan view of a fourth embodiment of the power semiconductor package. The embodiment shown in FIG. 4 is similar to the embodiment shown in FIG. 3. Different, however, passive components 118 such as resistors and/or capacitors which comprise part of the sensing circuit that includes the logic device 120 and the magnetic field sensor 104 are also integrated in the same package as the sensor 104, logic device 120 and power semiconductor die 102. The passive components 118 are attached to different ones of the package leads 100. Electrical conductors 110 such as wire bonds, wire ribbons, etc. electrically connect the passive components 118 to the logic device 120 and/or the magnetic field sensor 104. As such, the passive components 118 are electrically connected to the magnetic field sensor 104 and the logic device 120 to form the desired sensing circuit.

Figure 5:
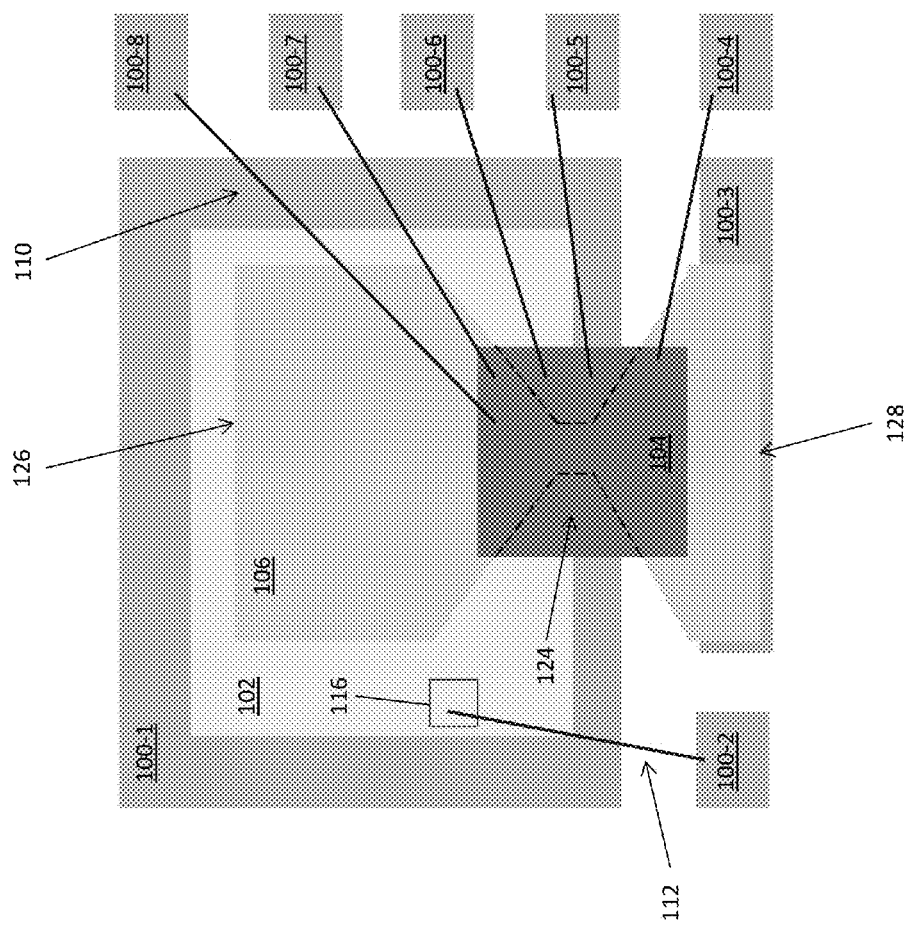
FIG. 5 illustrates a top down plan view of a fifth embodiment of a power semiconductor package having an integrated magnetic field sensor.

FIG. 5 illustrates a top down plan view of a fifth embodiment of the power semiconductor package. The embodiment shown in FIG. 5 is similar to the embodiment shown in FIGS. 1A and 1B. Different, however, the metal clip 106 has a tapered region 124 for which the width of the metal clip 106 reduces to less than the width of the magnetic field sensor 104 and the sensor 104 is positioned over the tapered region 124. The tapered region 124 is interposed between wider opposing end regions 126, 128 of the metal clip 106. The portion of the tapered region 124 disposed under the magnetic field sensor 104 and having a narrower width than the sensor 104 is shown in dashed lines in FIG. 5 since this section of the tapered region 124 is covered by the magnetic field sensor 104 and therefore out of view.

Figure 6:
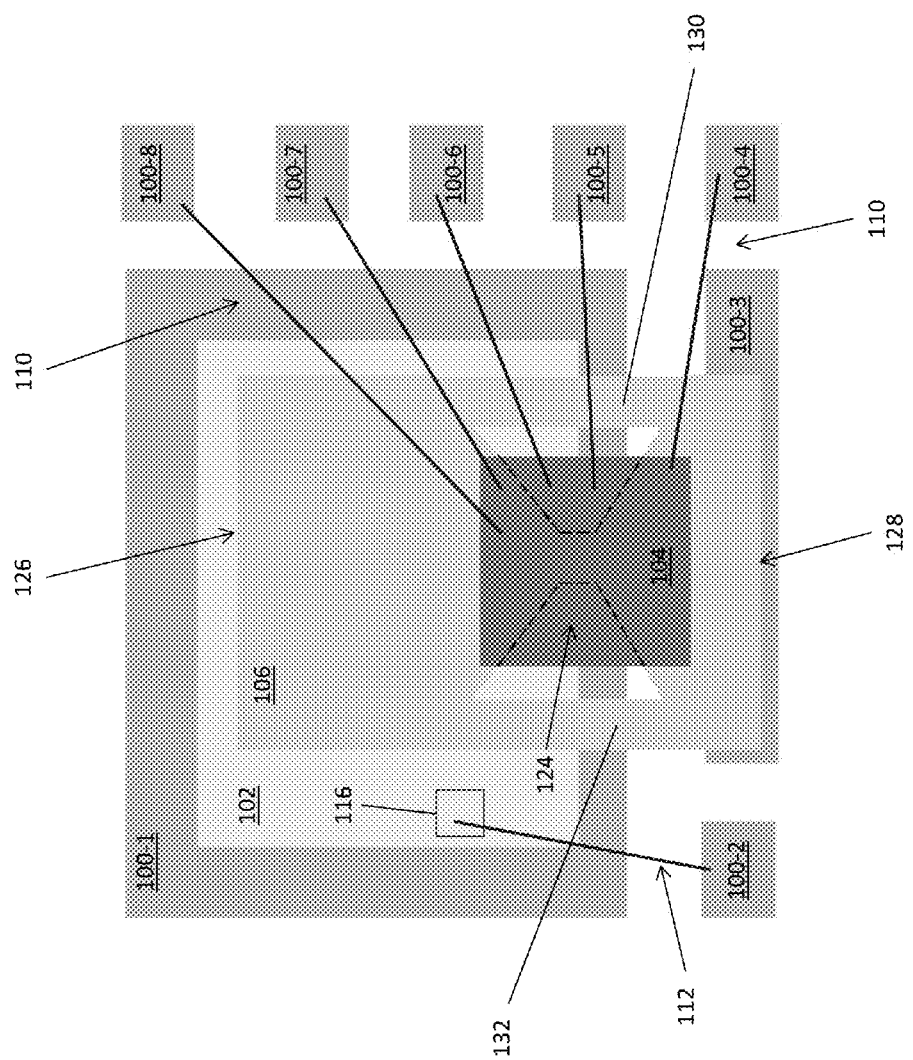
FIG. 6 illustrates a top down plan view of a sixth embodiment of a power semiconductor package having an integrated magnetic field sensor.

FIG. 6 illustrates a top down plan view of a sixth embodiment of the power semiconductor package. The embodiment shown in FIG. 6 is similar to the embodiment shown in FIG. 5. Different, however, the metal clip 106 further includes lateral branches 130, 132 which extend in parallel with the tapered region 124 between the opposing end regions 126, 128. The lateral branches 130, 132 are spaced apart from the tapered region 124 and uncovered by the magnetic field sensor 104. The addition of the lateral branches 130, 132 allows the metal clip 106 to handle more current than the clip configuration illustrated in FIG. 5. However, additional calibration effort and offset values may be needed since the entire current pathway does not run under the magnetic field sensor 104. As such, the magnetic field sensed by the magnetic field sensor 104 does not represent the total current flowing though the pathway but instead only the portion of the current flowing under the sensor 104.

Figure 7:
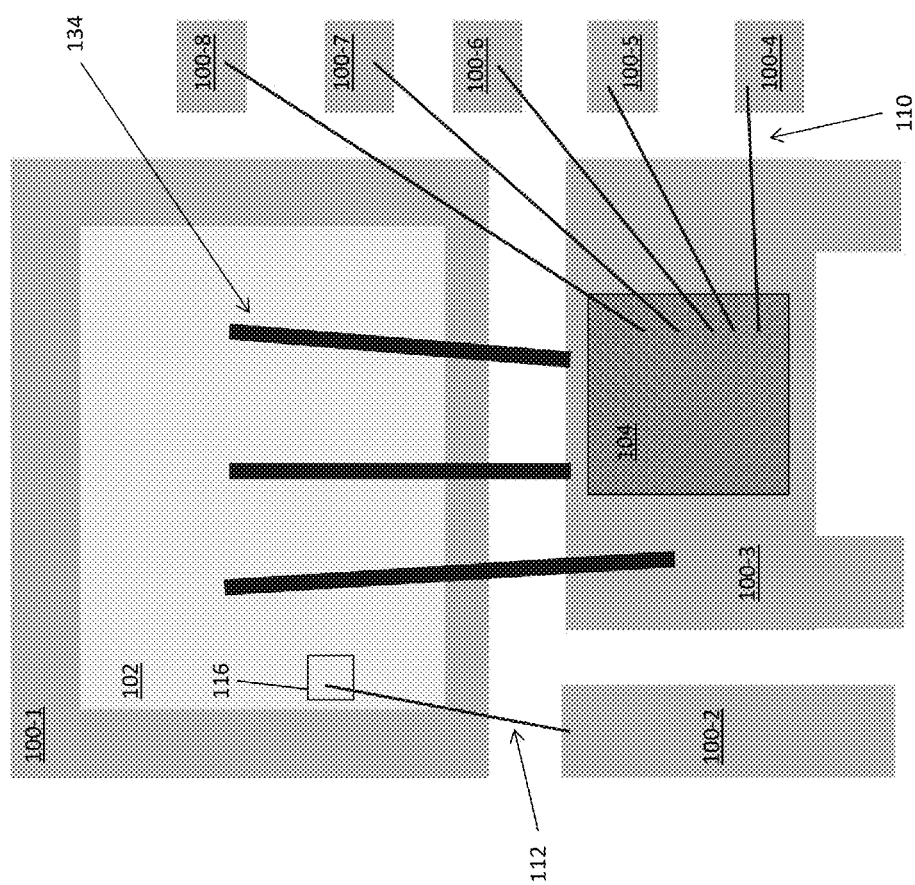
FIG. 7 illustrates a top down plan view of a seventh embodiment of a power semiconductor package having an integrated magnetic field sensor.

FIG. 7 illustrates a top down plan view of a seventh embodiment of the power semiconductor package. The embodiment shown in FIG. 7 is similar to the embodiment shown in FIGS. 1A and 1B. Different, however, the magnetic field sensor 104 is disposed on a package lead 100-3 different than the lead 100-1 to which the power semiconductor die 102 is attached. The lead 100-3 on which the magnetic field sensor 104 is disposed provides an electrical connection to the power semiconductor die 102 through one or more electrical conductors 134 such as wire bonds, wire ribbons, etc. One or more of these electrical conductor(s) 134 are interposed between the power semiconductor die 102 and the magnetic field sensor 104. The magnetic field sensor 104 is operable to sense the magnetic field produced by current flowing in the current pathway realized by the lead 100-3 on which the magnetic field sensor 104 is disposed and each electrical conductor 134 connected to this lead 100-3 and interposed between the power semiconductor die 102 and the magnetic field sensor 104.

Figure 8:
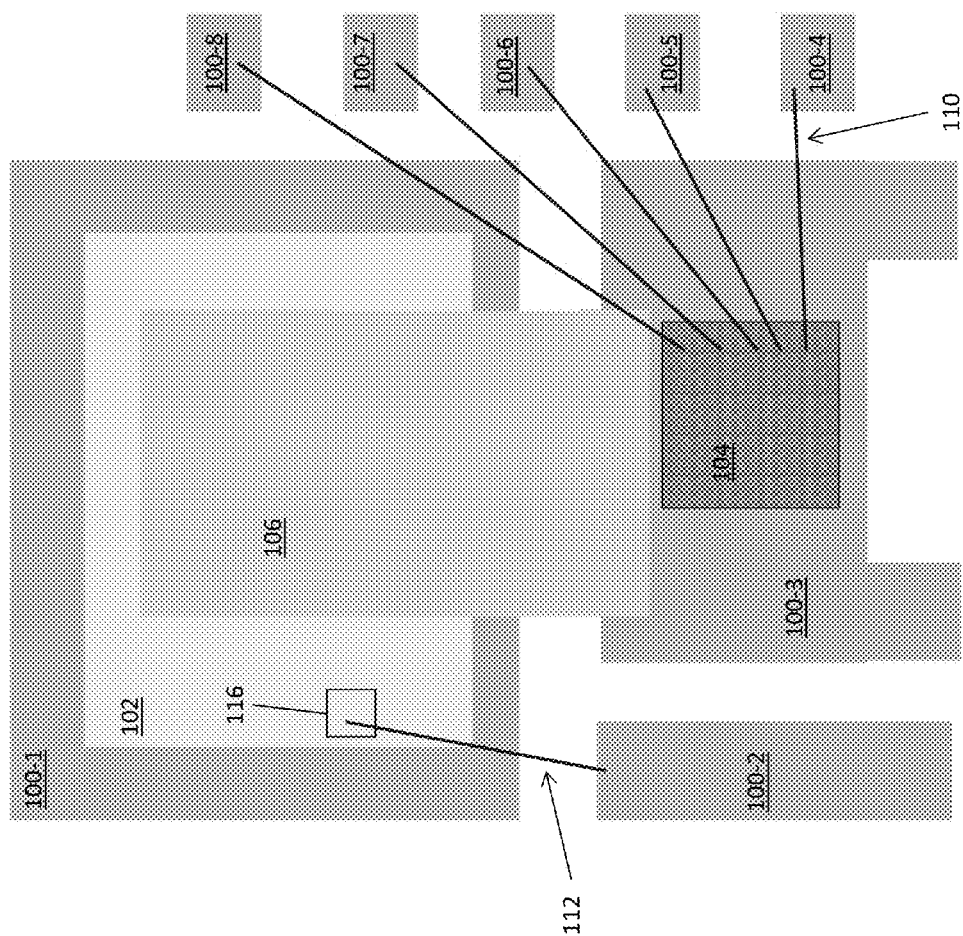
FIG. 8 illustrates a top down plan view of an eighth embodiment of a power semiconductor package having an integrated magnetic field sensor.

FIG. 8 illustrates a top down plan view of an eighth embodiment of the power semiconductor package. The embodiment shown in FIG. 8 is similar to the embodiment shown in FIG. 7. Different, however, the electrical connection between the lead 100-3 on which the magnetic field sensor 104 is disposed and the power semiconductor die 102 is provided by a metal clip 106 instead of wire bonds or ribbons. The magnetic field sensor 104 is operable to sense the magnetic field produced by current flowing in the current pathway realized by the lead 100-3 on which the magnetic field sensor 104 is disposed and the metal clip 106 which electrically connects this lead 100-3 to the power semiconductor die 102.

Figure 9A:
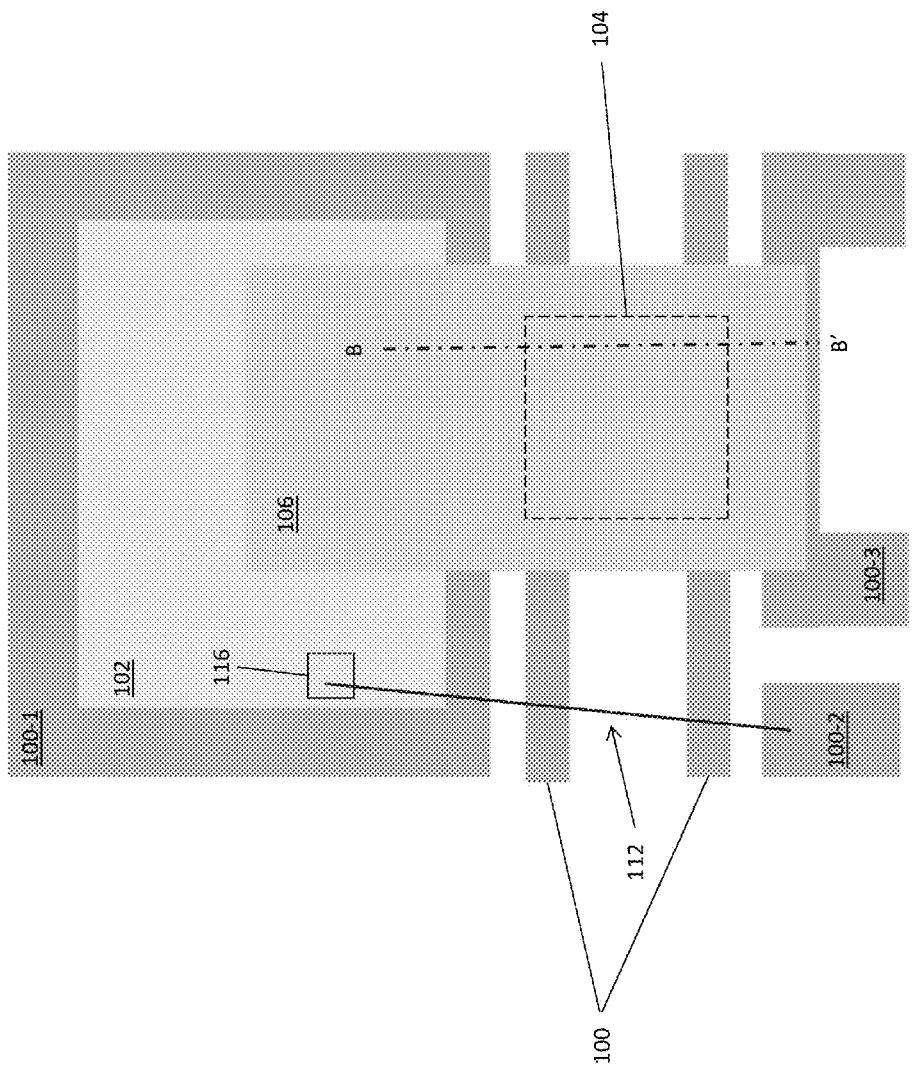
FIG. 9A illustrates a top down plan view of a ninth embodiment of a power semiconductor package having an integrated magnetic field sensor.
Figure 9B:
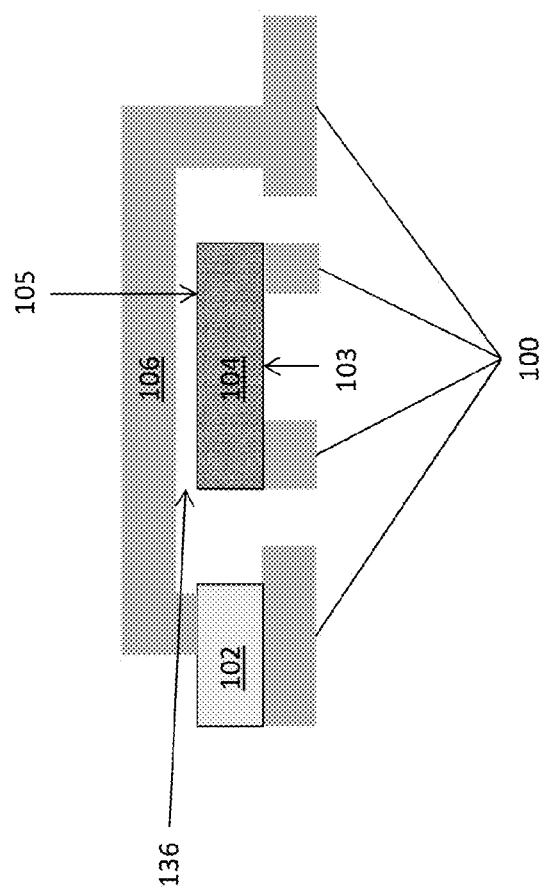
FIG. 9B illustrates a cross-sectional view of the package along the line labeled B-B' in FIG. 9A.

FIG. 9A illustrates a top down plan view of a ninth embodiment of the power semiconductor package, and FIG. 9B illustrates a cross-sectional view of the package along the line labeled B-B' in FIG. 9A. The embodiment shown in FIGS. 9A and 9B is similar to the embodiment shown in FIGS. 1A and 1B. Different, however, the magnetic field sensor 104 is disposed under a metal clip 106 which electrically connects one of the package leads 100-3 to the power semiconductor die 102. The magnetic field sensor 104 is shown as a dashed box in FIG. 9A because the sensor 104 is covered by the metal clip 106 in this view. One or more of the package leads 100 extend under the metal clip 106 to provide electrical connections at the backside 103 of the magnetic field sensor 104. Mechanical contact between the topside 105 of the magnetic field sensor 104 and the overlying metal clip 106 is not necessary, because the sensor 104 is supported by one or more of the underlying package lead(s) 110. The topside 105 of the magnetic field sensor 104 can be galvanically isolated from the overlying metal clip 106 by e.g. an air gap 136. In addition or alternatively, a spacer (not shown in FIG. 9B) can separate the magnetic field sensor 104 from the metal clip 106 e.g. as shown in FIG. 1B. For example, the gap 136 can be filled with some kind of polymer such as mold compound, non-conductive adhesive or non-conductive film/tape. Alternatively, a conductive material can fill the gap 136 between the sensor 104 and the overlying metal clip 106 in the case of low voltage devices. Different than FIG. 1B, the spacer would be interposed between the topside 105 of the magnetic field sensor 104 and the overlying metal clip 106.

Figure 10:
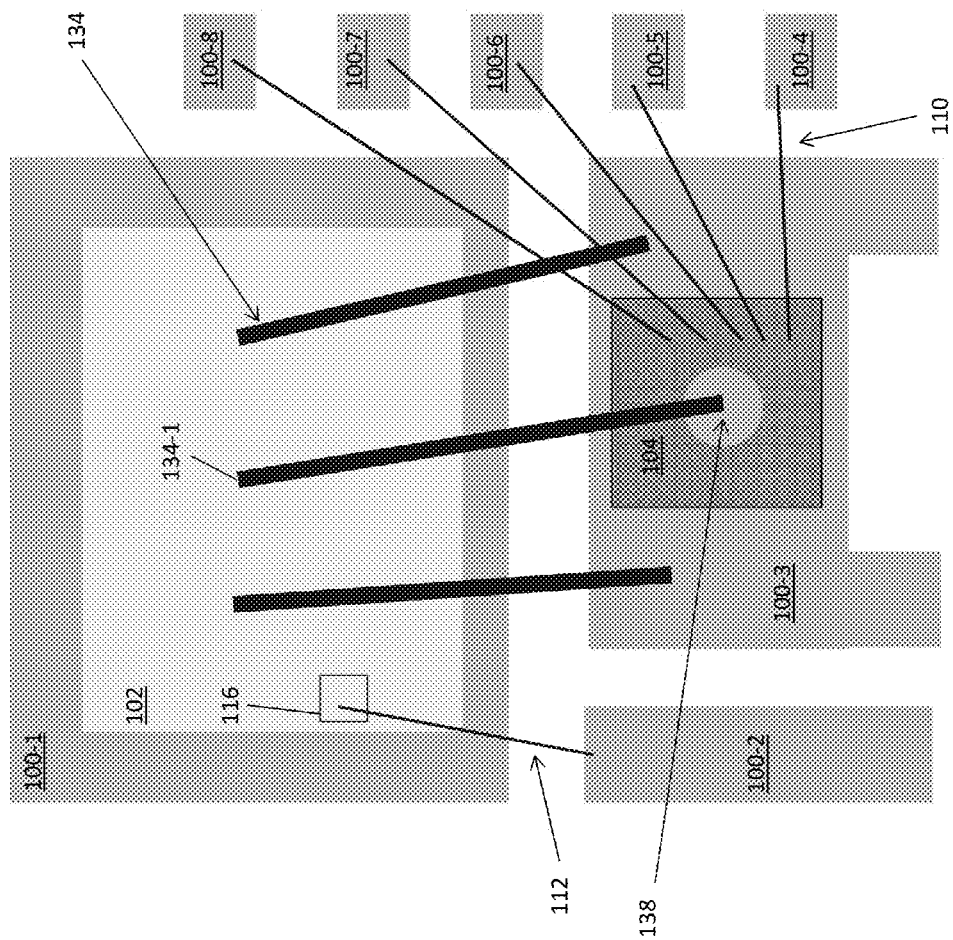
FIG. 10 illustrates a top down plan view of a tenth embodiment of a power semiconductor package having an integrated magnetic field sensor.

FIG. 10 illustrates a top down plan view of a tenth embodiment of the power semiconductor package. The embodiment shown in FIG. 10 is similar to the embodiment shown in FIG. 7. Different, however, the magnetic field sensor 104 has an opening 138 extending through the sensor 104. Various semiconductor technologies readily enable the formation of such an opening 138 e.g. by masking and chemical etching processes, laser etching processes, etc., and therefore no further explanation is provided in this regard. At least one electrical conductor 134-1 is attached to the lead 100-3 on which the magnetic field sensor 104 is disposed, through the opening 138 in the sensor 104. The other end of this lead 134-1 is attached to the power semiconductor die 102 to complete the corresponding electrical connection. The magnetic field sensor 104 is operable to sense the magnetic field produced by current flowing in the current pathway realized by the lead 100-3 on which the magnetic field sensor 104 is disposed and the electrical conductor 134-1 attached to this lead 100-3 through the opening 138 in the magnetic field sensor 104.

Figure 11A:
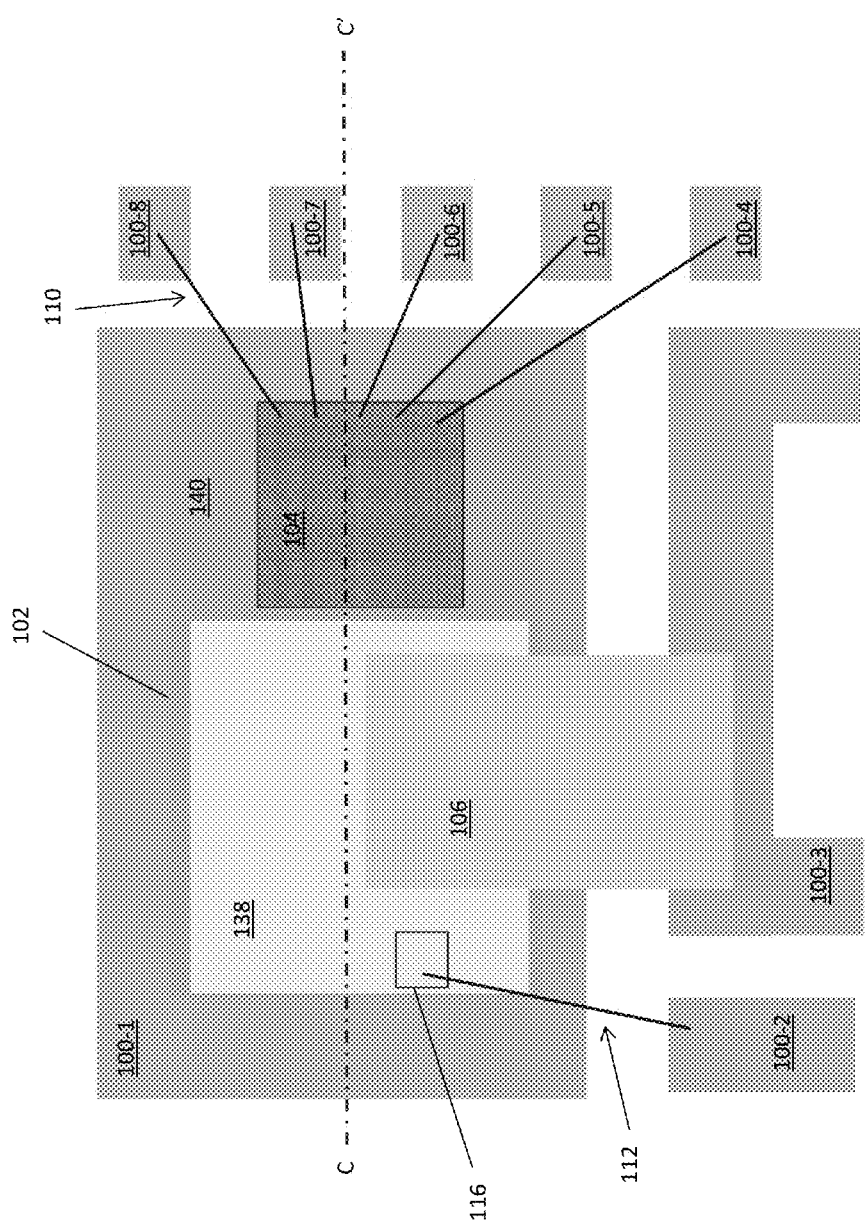
FIG. 11A illustrates a top down plan view of an eleventh embodiment of a power semiconductor package having an integrated magnetic field sensor.
Figure 11B:
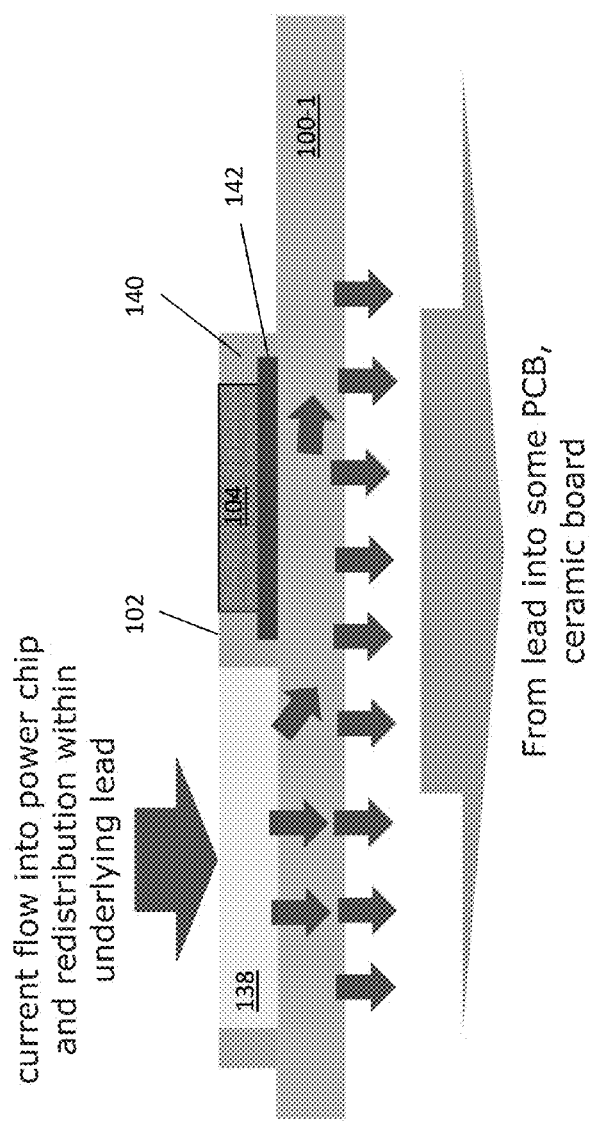
FIG. 11B illustrates a cross-sectional view of the package along the line labeled C-C' in FIG. 11A.

FIG. 11A illustrates a top down plan view of an eleventh embodiment of the power semiconductor package, and FIG. 11B illustrates a cross-sectional view of the package along the line labeled C-C' in FIG. 11A. The embodiment shown in FIGS. 11A and 11B is similar to the embodiment shown in FIGS. 1A and 1B. Different, however, the magnetic field sensor 104 is embedded in the same die 102 as the power semiconductor device(s) 140. The die 102 includes a semiconductor body 140 comprising Si or a compound semiconductor such as SiC, GaAs, GaN, etc. The power device(s) 138 are formed in the semiconductor body 140. The magnetic field sensor 104 is disposed in the same semiconductor body 140 as the power device(s) 138, but galvanically isolated from the power device(s) 138. The galvanic isolation 142 can be integrated in the semiconductor body 140, or as part of a bondline with the underlying package lead 100-1. In each case, the current flow pathway into the power device(s) 138 and out of the power device(s) 138 to some PCB, ceramic substrate, etc. (not shown) is illustrated in FIG. 11B by a series of arrows. As shown in FIG. 11B, some of the current spreads out under the magnetic field sensor 104 in the lead 100-1 to which the die 102 is attached. The magnetic field produced by the current flowing in this part of the lead 100-1 is sensed by the integrated magnetic field sensor 104. The magnitude of the corresponding signal generated by the sensor 104 is proportional to the amount of current flowing in this part of the current pathway. The metal clip 106 shown in FIG. 11A can be replaced by a different type of electrical conductor such as wire bonds, wire ribbons, etc.

Figure 12:
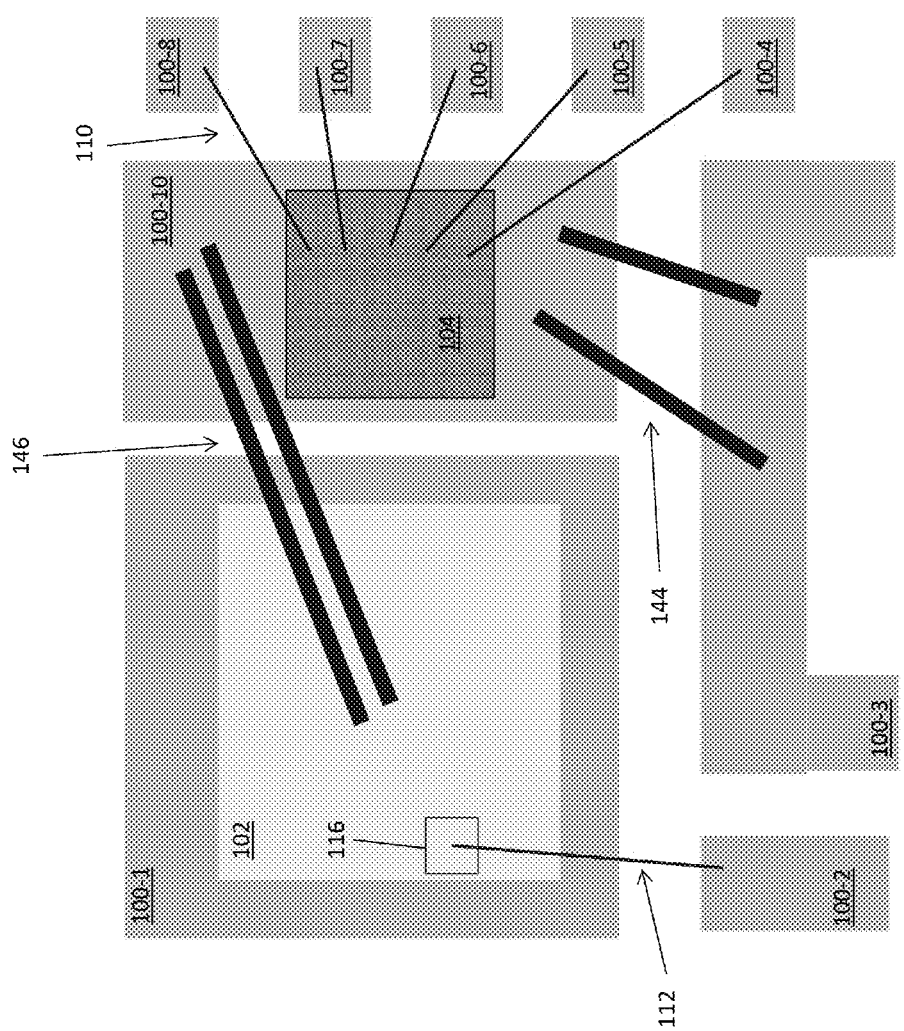
FIG. 12 illustrates a top down plan view of a twelfth embodiment of a power semiconductor package having an integrated magnetic field sensor.

FIG. 12 illustrates a top down plan view of a twelfth embodiment of the power semiconductor package. The embodiment shown in FIG. 12 is similar to the embodiment shown in FIG. 7. Different, however, the magnetic field sensor 104 is disposed on a third lead 100-10. A first set 144 of one or more electrical conductors such as wire bonds, wire ribbons, etc. each have a first end attached to a second lead 100-3 and a second end attached to the third lead 100-10. A second set 146 of one or more electrical conductors such as wire bonds, wire ribbons, etc. each have a first end attached to the third lead 100-10 and a second end attached to the power semiconductor die 102 which is attached to a first lead 100-1. The magnetic field sensor 104 is interposed between the first set 144 and the second set 146 of one or more electrical conductors, and senses the magnetic field produced by the current flowing from the first set 144 of one or more electrical conductors to the second set 146 of one or more electrical conductors through the third lead 100-10.

Figure 13A:
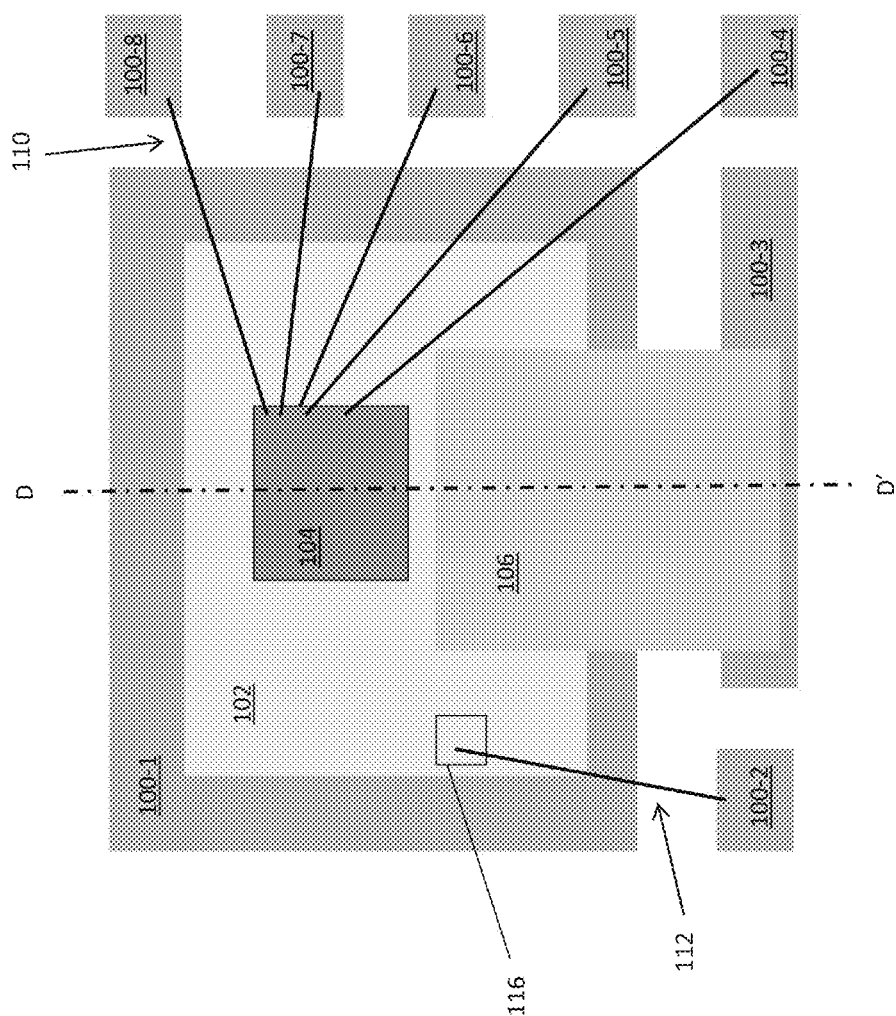
FIG. 13A illustrates a top down plan view of a thirteenth embodiment of a power semiconductor package having an integrated magnetic field sensor.
Figure 13B:
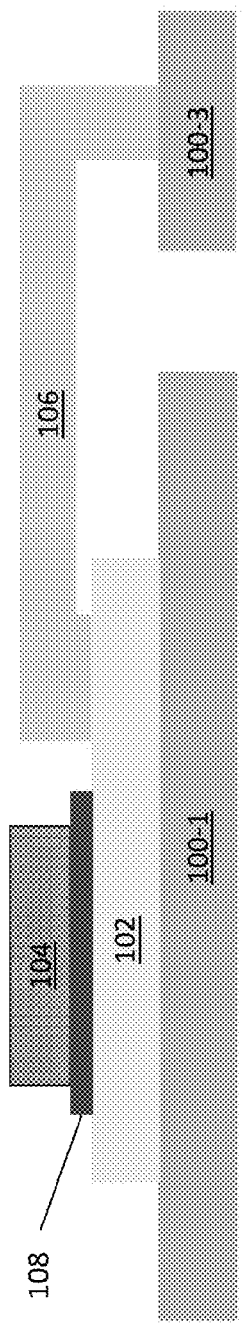
FIG. 13B illustrates a cross-sectional view of the package along the line labeled D-D' in FIG. 13A.

FIG. 13A illustrates a top down plan view of a thirteenth embodiment of the power semiconductor package, and FIG. 13B illustrates a cross-sectional view of the package along the line labeled D-D' in FIG. 13A. The embodiment shown in FIGS. 13A and 13B is similar to the embodiment shown in FIGS. 1A and 1B. Different, however, the magnetic field sensor 104 is disposed on the power semiconductor die 102 instead of the metal clip 106 which electrically connects the corresponding package lead 100-3 to the power semiconductor die 102. The magnetic field sensor 104 is galvanically isolated from the power semiconductor die 102. In one embodiment, a spacer 108 separates the magnetic field sensor 104 from the power semiconductor die 102. The spacer 108 can provide both galvanic isolation and magnetic field reduction at the sensor 104 as previously described herein.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A power semiconductor package, comprising:
a substrate having a plurality of metal leads;
a power semiconductor die attached to a first one of the leads;

a metal clip included in the power semiconductor package, the metal clip electrically connecting one or more of the leads to the power semiconductor die or to another one of the leads; and a magnetic field sensor positioned over or under, and galvanically isolated from, the metal clip, and located in close proximity to a current pathway of the power semiconductor die, the magnetic field sensor being operable to generate a signal in response to a magnetic field produced by current flowing in the current pathway, the magnitude of the signal being proportional to the amount of current flowing in the current pathway.

2. A power semiconductor package, comprising:

a substrate having a plurality of metal leads;

a power semiconductor die attached to a first one of the leads; and a magnetic field sensor integrated in the same power semiconductor package as the power semiconductor die and positioned in close proximity to a current pathway of the power semiconductor die, the magnetic field sensor being operable to generate a signal in response to a magnetic field produced by current flowing in the current pathway, the magnitude of the signal being proportional to the amount of current flowing in the current pathway, wherein the magnetic field sensor is disposed on a second one of the leads which is electrically connected to the power semiconductor die through one or more electrical conductors interposed between the power semiconductor die and the magnetic field sensor.

3. A power semiconductor package, comprising:

a substrate having a plurality of metal leads;

a power semiconductor die attached to a first one of the leads; and a magnetic field sensor integrated in the same power semiconductor package as the power semiconductor die and positioned in close proximity to a current pathway of the power semiconductor die, the magnetic field sensor being operable to generate a signal in response to a magnetic field produced by current flowing in the current pathway, the magnitude of the signal being proportional to the amount of current flowing in the current pathway, wherein the magnetic field sensor is disposed on a second one of the leads which is electrically connected to the power semiconductor die through one or more electrical conductors, wherein the magnetic field sensor has an opening extending through the sensor, and wherein at least one of the one or more electrical conductors is attached to the second lead through the opening in the magnetic field sensor.

4. A power semiconductor package, comprising:

a substrate having a plurality of metal leads;

a power semiconductor die attached to a first one of the leads; and a magnetic field sensor integrated in the same power semiconductor package as the power semiconductor die and positioned in close proximity to a current pathway of the power semiconductor die, the magnetic field sensor being operable to generate a signal in response to a magnetic field produced by current flowing in the current pathway, the magnitude of the signal being proportional to the amount of current flowing in the current pathway, wherein the magnetic field sensor is embedded in the power semiconductor die and galvanically isolated from each power device included in the power semiconductor die.

5. A power semiconductor package, comprising:

a substrate having a plurality of metal leads;

a power semiconductor die attached to a first one of the leads;

a magnetic field sensor integrated in the same power semiconductor package as the power semiconductor die and positioned in close proximity to a current pathway of the power semiconductor die, the magnetic field sensor being operable to generate a signal in response to a magnetic field produced by current flowing in the current pathway, the magnitude of the signal being proportional to the amount of current flowing in the current pathway;

a first set of one or more electrical conductors having a first end attached to a second one of the leads and a second end attached to a third one of the leads; and a second set of one or more electrical conductors having a first end attached to the third lead and a second end attached to the power semiconductor die, wherein the magnetic field sensor is disposed on the third lead and interposed between the first and the second set of one or more electrical conductors.

6. A power semiconductor package, comprising:

a substrate having a plurality of metal leads;

a power semiconductor die attached to a first one of the leads; and a magnetic field sensor integrated in the same power semiconductor package as the power semiconductor die and positioned in close proximity to a current pathway of the power semiconductor die, the magnetic field sensor being operable to generate a signal in response to a magnetic field produced by current flowing in the current pathway, the magnitude of the signal being proportional to the amount of current flowing in the current pathway, wherein the magnetic field sensor is disposed on the power semiconductor die.

7. The power semiconductor package of claim 1, wherein the magnetic field sensor is a magnetoresistive sensor or a Hall sensor.

8. The power semiconductor package of claim 1, wherein the power semiconductor package further comprises a spacer separating the magnetic field sensor from the metal clip.

9. The power semiconductor package of claim 8, wherein the spacer is selected from the group consisting of: a semiconductor die; a polymer; a ceramic; a non-conductive adhesive; and a non-conductive film.

10. The power semiconductor package of claim 1, wherein the metal clip has a tapered region for which the width of the metal clip reduces to less than the width of the magnetic field sensor, and wherein the magnetic field sensor is positioned over or under the tapered region.

11. The power semiconductor package of claim 10, wherein the tapered region is interposed between wider opposing end regions of the metal clip, wherein the metal clip further comprises lateral branches which extend in parallel with the tapered region between the opposing end regions, wherein the lateral branches are spaced apart from the tapered region, and wherein the lateral branches are uncovered by the magnetic field sensor.

12. The power semiconductor package of claim 6, wherein the magnetic field sensor is galvanically isolated from the power semiconductor die.

13. The power semiconductor package of claim 6, further comprising a spacer separating the magnetic field sensor from the power semiconductor die.

14. The power semiconductor package of claim 6, further comprising:
- a plurality of electrical conductors each having a first end attached to one of the leads and a second end attached to a side of the magnetic field sensor facing away from the power semiconductor die.

15. The power semiconductor package of claim 1, further comprising:
- a plurality of passive components attached to different ones of the leads; and
- a plurality of electrical conductors electrically connecting the passive components to the magnetic field sensor.

16. The power semiconductor package of claim 1, further comprising a logic device attached to the metal clip and operable to control the magnetic field sensor.

17. The power semiconductor package of claim 16, further comprising:
- a plurality of passive components attached to different ones of the leads; and
- a plurality of electrical conductors electrically connecting the passive components to the magnetic field sensor and the logic device.

* * * * *